United States Patent [19]

Lorig et al.

[11] Patent Number: 5,016,141
[45] Date of Patent: May 14, 1991

[54] PRINTED CIRCUIT BOARD EDGE-LOCKING DEVICE

[75] Inventors: James D. Lorig; John A. Shearer, both of Tucson, Ariz.

[73] Assignee: Hughes Aircraft Company, Los Angeles, Calif.

[21] Appl. No.: 521,306

[22] Filed: May 9, 1990

[51] Int. Cl.$^5$ .............................................. H05K 7/14
[52] U.S. Cl. ..................... 361/415; 361/412; 361/419; 361/420; 403/373; 411/55; 411/60; 439/60; 439/76
[58] Field of Search ................. 174/250, 255, 386, 88; 361/397, 412, 415, 419, 420; 439/55, 60, 76, 573, 574, 575, 556, 564; 165/80.2, 80.3; 403/409.1, 373, 374; 411/55, 60

[56] References Cited

FOREIGN PATENT DOCUMENTS 2018117 11/1971 Fed. Rep. of Germany ........ 411/55

*Primary Examiner*—Leo P. Picard
*Assistant Examiner*—Donald A. Sparks
*Attorney, Agent, or Firm*—C. D. Brown; R. M. Heald; W. K. Denson-Low

[57] ABSTRACT

A device (24) for edge-locking printed circuit wiring boards (12, 14) within a support chassis (10) has an elongated clamping body (40) with deformable clamping strips (42, 44), one at each side of the body (40). The clamping body (40) is located on the top surface of a central wall (32) having sloping sides which is integral with a support chassis (10) cross-wall. Screws (36) on advancing into the body, (40) pull the clamping strips (42, 44) onto the central wall (32) deforming the strips into pressure contact with the wiring board (12, 13) edge portions. An alternative version substitute at least two ferrules (46) for the central wall (32).

7 Claims, 2 Drawing Sheets

PRINTED CIRCUIT BOARD EDGE-LOCKING DEVICE

BACKGROUND OF THE INVENTION

1. Field of the Invention

The present invention relates generally to printed circuit wiring boards, and, more particularly, to an adjustable clamp lock for edge-locking such boards within individual mounting recesses.

2. Description of Related Art

Printed circuit boards generally comprise a rectangular base made of an electrically insulative material onto which circuit components are surface mounted and interconnection between the components is established by deposited leads of a conductive material laid down in a predetermined pattern. Interconnection between boards or between a board and other equipment is typically achieved via deposited electrodes arranged along a board edge. In order to protect the components and interconnection leads, the boards are typically mounted in an edge supported manner.

Known systems for securing printed wiring boards are of three main categories. First of all, so-called "complete perimeter systems" include apparatus which clampingly engage the full board periphery. Other systems have isolated pads which coact to secure the board. Finally, two-edge mounting systems are especially desirable when high volume efficiency, parallel face mounting and ease of assembly are required factors.

However, available clamping devices for two-edge mounting of boards present most difficult problems for a printed circuit board structural support chassis. For example, they frequently utilize a single screw to actuate the device, and the resultant configuration produces high loads in a relatively small area which can lead to structural failure. Also, these known devices do not provide more than minimal vibrational damping, are relatively expensive to manufacture, and do not provide a desired minimum preload after material stress relaxation and creep have set in. Still further, available two-edge mounting devices are not completely satisfactory where the boards or supporting structures must survive in increasingly hostile environments after long term storage, e.g., control system for a missile.

Accordingly, it would be desirable to have improved two-edge mounting systems at least to the extent of eliminating deficiencies of presently known two-edge mounting systems.

SUMMARY OF THE INVENTION

A printed wiring board support chassis with which the locking device of the present invention is most advantageously employed essentially includes a structure within which a pair of boards are received in facing spaced apart condition, each board having a pair of opposite edges received with individual recesses. More particularly, the structure has outer walls separated by a pair of cross-walls, one at each end with the recesses being located on the inner cross-wall surfaces.

In accordance with a first embodiment of the invention, at least one cross-wall includes an integral center wall which extends upwardly between the two recesses with opposite side walls sloping toward one another and with the boards each having a pair of opposite edges resting in the recesses. A plurality of oversize axial openings in the center wall receive individual machine screws with their slotted heads located outside the structure and of such length as to have end portions extending outwardly from the center wall.

An elongated clamping member has a central portion with an equal plurality of spaced apart threaded openings corresponding to the openings in the central wall. Downwardly extending, deformable clamping strips are provided, one on each side of the clamping member central portion. Advancing screws into the clamping member draws the member onto the sloping central wall which bends the clamping strips into engagement with the boards to achieve the clamping securement of the boards desired. In effect, each board is wedged between the outside wall of the structure and a flared out clamping strip.

A second version of the invention substitutes a plurality of generally cylindrical metal ferrules for the sloping central wall portion as the cross-wall. In use, the screws on being threaded into the clamping member cause the clamping strips to be cammed outwardly by the ferrules and engage the circuit boards.

DESCRIPTION OF THE PREFERRED EMBODIMENT

Figure 1:
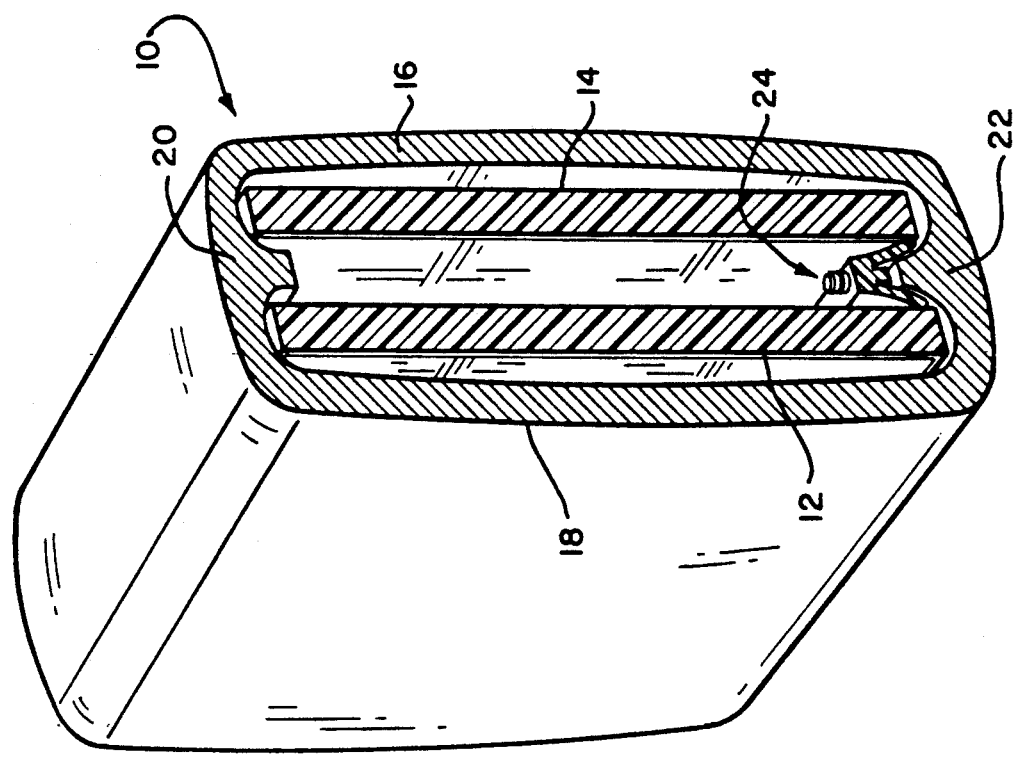
FIG. 1 is a perspective view of a pair of printed circuit boards received within a typical two-edge mounting system.
Figure 3:
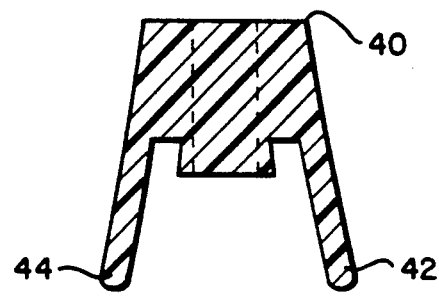
FIG. 3 is an end elevational view of a clamping member for use in the present invention.
Figure 4:
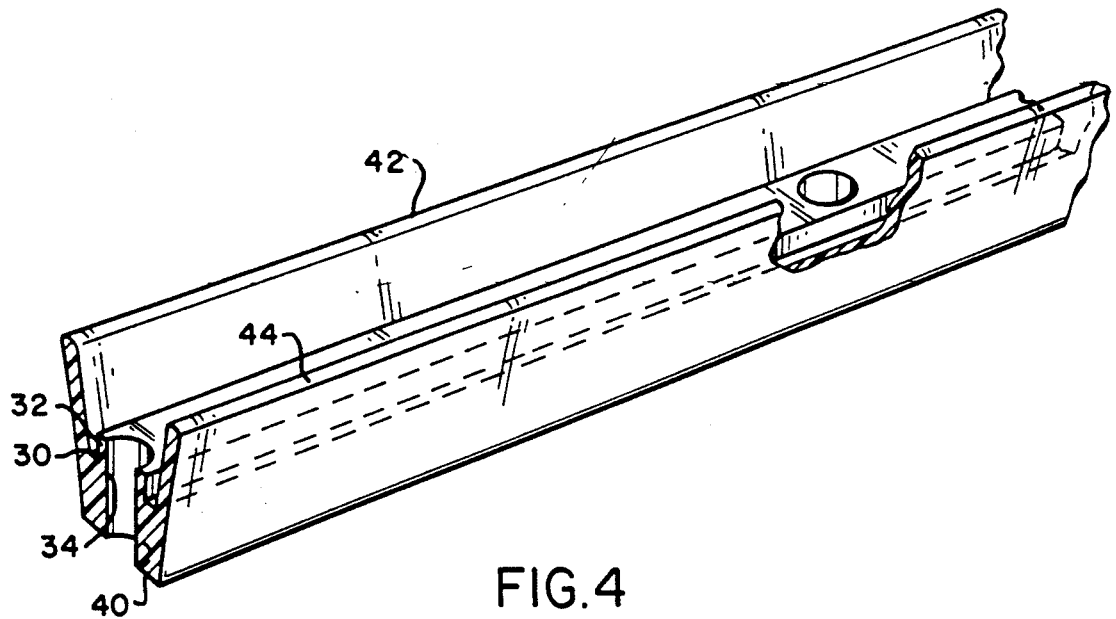
FIG. 4 is a side elevational view of the clamping member.

With reference now particularly to FIG. 1 of the drawing, a typical two-edge support chassis 10 for holding first and second printed wiring circuit boards 12 and 14 by a pair of opposite edges and in spaced apart relation is shown. Specifically, the support chassis includes a pair of side walls 16 and 18 held spaced from one another by upper and lower cross-walls 20 and 22, respectively. As will be more particularly described, a locking device 24 of this invention releasably secures the edges of the boards 12 and 14 within the chassis central space 26 in the region of the cross-walls.

Figure 2A:
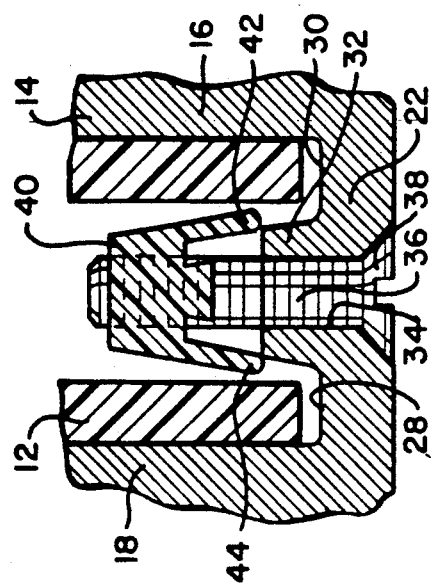
FIGS. 2A and 2B are end elevational, sectional, partially fragmentary views of the invention shown prior to locking and in fully locked position, respectively.
Figure 2B:
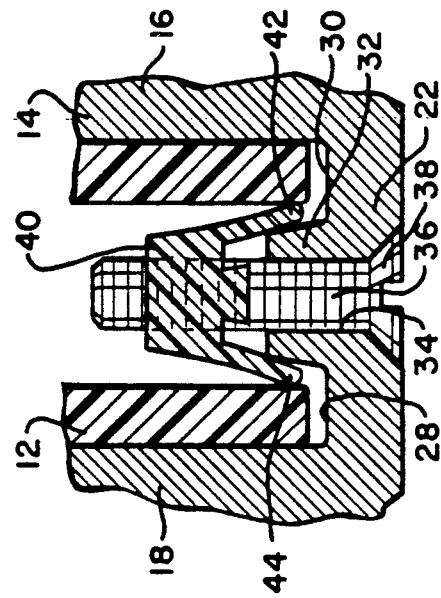

For the ensuing detailed description of the locking device, reference is first made to FIGS. 2A and 2B. The cross-wall 22 is seen to be integrally connected with both chassis side walls 16 and 18 and to include first and second recesses 28 and 30 within which the lower edges of the boards 12 and 14 are restingly received, respectively. Centrally located between the side walls is a raised center wall 32 which extends upwardly between the sidewalls just past the lower edges of the two boards and has lateral sides which slope upwardly toward one another. Spaced apart openings 34 extend vertically through the center wall. An equal number of machine screws 36 each have an undersize diameter permitting sliding receipt within an individual opening 34 and an overall length such that when inserted within the opening with its slotted head 38 external to the cross-wall the inner end of the screw extends outwardly of the center wall 32.

An elongated clamping member 40 has a plurality of openings corresponding in number and spacing to openings 34 in the central wall so the two sets of openings can be aligned. The clamping member openings are threaded for similar receipt of the machine screws therein. Also, the member 40 has a pair of deformable clamping strips 42 and 44, one on each side, extending at an angle from the clamping member body. As best seen in FIG. 2A, when the clamping member is initially threaded onto the screws 36, and before locking, the clamping strips merely touch the sloping center wall upper edges. Also, it is to be noted at this time that the outer surfaces of the clamping strips do not now contact the boards.

When it is desired to lock the boards in place within the support chassis 10, the machine screws 36 are advanced into the clamping member 40 by the use of a conventional screwdriver (not shown), for example, acting on the slotted head 38. In this way the clamping strips are pulled down onto the central wall 32 causing the strips to be deformed laterally outward and clamp against the board as shown in FIG. 2B. The two boards now have their edge portions clamped against the support chassis side walls in a secure manner.

Figure 5:
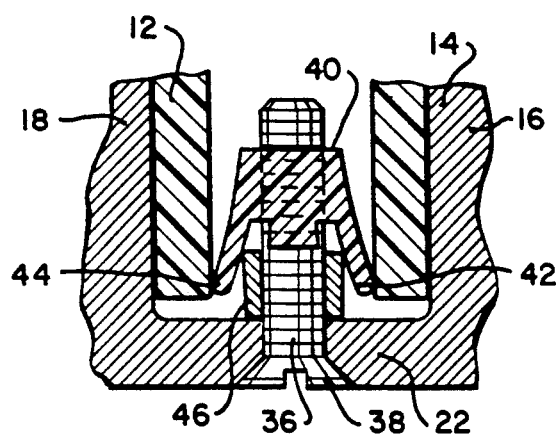
FIG. 5 is an end elevational sectional view similar to FIG. 2 of a further embodiment of this invention.

FIG. 5 depicts an alternative embodiment of the invention which differs essentially from the first described embodiment in eliminating the central wall 32 integral with the support chassis cross-wall 22. Instead, the support chassis cross-wall is merely flat surfaced and a plurality of cylindrical ferrules 46 are provided, one for each opening 34. The ferrule is so dimensioned that when the screws 36 thread into the clamping member 40, the clamping strips are deformed on the ferrule upper edge and clamp against the boards as in the first described embodiment.

The clamping member 40 and clamping strips 42 and 44 are preferably constructed of a one-piece molded plastic. Optionally, the clamping member can be made of a large number or composite of metallic materials.

The described printed circuit board locking device can be advantageously employed with any board size (height or length) and is particularly adaptable for miniaturization. Also, in addition to providing external actuation access, which may be desirable or even necessary in certain situations, the described device can be made with variable spring rates for selectively preloading specific portions of the board edges. Still further, clamping preload flexibility is enhanced by tailoring the clamping member shape and varying the number and spacing of actuation screws. Yet another advantage is that since the clamping force is distributed, this minimizes stress on low moduli and fragile board materials.

From the described construction of the invention it is an advantageous result minimum useable preload can be provided that will exist after short-term stress relaxation and long-term creep have been experienced. Also, a relatively wide variation in assembly screw torques can be employed. Still further, a desired range of preloading can be achieved by tactile sensing alone and without the need for sensitive or expensive equipment.

It has been found that when any movement occurs between the printed circuit board and the locking device it is damped (so-called "coulomb damping") by friction between the parts. Also, when the locking device material is disturbed so-called hysteresis damping occurs through internal friction. In both cases the energy is released through heat generation resulting in board movement being damped.

Although the invention has been described in connection with preferred embodiments, it is to be understood that those skilled in the appertaining arts may effect modifications that come within the spirit of the present invention and are also within the ambit of the appended claims. For example, although only one board edge-locking device has been described, namely along the board lower edge, a second identical device can also be used clamping the opposite (upper) board edge. Also, instead of screws, an over-center mechanism can be applied to the locking device.

What is claimed is:

1. A locking device combined with a pair of spaced apart printed circuit boards located within a support chassis having a pair of outer side walls held apart by upper and lower cross-walls, said circuit boards being edge supported on at least one of the cross-walls, comprising:

center wall means integral with the cross-wall supporting the circuit boards extending upwardly between facing circuit board edge portions, said center wall means opposite side surfaces sloping toward each other and at least two openings extending through the center wall means and adjacent cross-wall; and clamping means including, an elongated body having two openings aligned with the center wall means openings, first and second clamping strips respectively integral with opposite sides of the body and flared away from said body, and machine screws threaded from the outside of the support chassis through the center wall means openings into the body openings;

said screws on being threadedly advanced into the body openings, pull the clamping strips onto the center wall means sloping sides deforming the strips outwardly to clamp the board edge portions against the support chassis side walls.

2. Locking device as in claim 1, in which the clamping means elongated body and clamping strips are constructed of a deformable synthetic plastic material.

3. A locking device combined with spaced apart printed circuit boards positioned within a support chassis having first and second outer side walls separated by upper and lower cross-walls, the circuit boards being edge supported on at least one of the cross-walls, comprising:

at least two cylindrical ferrules having a central bore extending completely therethrough, said ferrules being positioned with the ferrule bores being respectively aligned with an individual opening in a cross-wall;

clamping means including, an elongated body having two openings alignable with the cross-wall openings and ferrules, first and second clamping strips respectively integral with opposite sides of the body and flared away from said body, and machine screws threaded from the outside of the support chassis through the cross-wall openings, ferrule opening and clamping means body openings;

said screws on being threadedly advanced into the body openings pull the clamping strips onto the ferrules deforming the strips outwardly to clamp the board edge portions against the support chassis side walls.

4. A device for releasably locking first and second printed circuit wiring boards within a support chassis chamber defined by first and second side walls separated a predetermined amount by a cross-wall, said boards each having an edge contacting an inner surface of the cross-wall and positioning facing edge portions of the boards in spaced apart relation, comprising:

means located on the cross-wall between the spaced apart portions of the boards, said means having parts extending between the facing board edge portions free from contacting the said board edge portions, said means including at least one opening aligned with at least one opening in the cross-wall;

an elongated body member having first and second sheetlike strips secured to opposite sides of the body member and flaring away from said member in the same direction, said member and sheetlike strips being mounted onto the means and being so dimensioned as to permit locating between the board spaced apart edge portions, said body member also including a plurality of generally parallel openings which are respectively alignable with the openings in the means and cross-wall;

a threaded screw received in each of the aligned openings with the driving end of the screw being located externally of the support chassis, each screw being dimensioned so as to slidingly pass through the openings in the cross-wall and means while being threadedly received within the body member;

said screws upon advancing within the body member pull the sheetlike strips onto the means causing the strips to deform toward and into contact with the board edge portions clamping them against the support chassis sidewalls.

5. A device as in claim 4, wherein said elongated body member and said sheetlike strips comprise a one-piece molded synthetic plastic structure.

6. A device as in claim 4, in which the means includes a wall integral with the cross-wall having opposite wall surfaces sloping toward each other on moving away from the cross-wall.

7. A device as in claim 4, in which the means comprise a plurality of ferrules, one for each openings in said cross-wall, said ferrules having a bore of such cross-sectional shape as to allow a screw to pass slidingly therethrough.

* * * * *